US012733297B2

(12) United States Patent
Kim et al.

(10) Patent No.: US 12,733,297 B2
(45) Date of Patent: Sep. 8, 2026

(54) DISPLAY DEVICE HAVING STEP COMPENSATION LAYERS IN AREAS OF A SUBSTRATE

(71) Applicant: LG Display Co., Ltd., Seoul (KR)

(72) Inventors: JeeHun Kim, Gimpo-si (KR); Hyeran Jeong, Goyang-si (KR); Sungeun Bae, Paju-si (KR); Hyo Seob Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 422 days.

(21) Appl. No.: 18/380,303

(22) Filed: Oct. 16, 2023

(65) Prior Publication Data

US 2024/0128407 A1 Apr. 18, 2024

(30) Foreign Application Priority Data

Oct. 17, 2022 (KR) ........................ 10-2022-0132975

(51) Int. Cl.

| | |
|---|---|
| ***H10H 20/831*** | (2025.01) |
| ***H10H 20/84*** | (2025.01) |
| ***H10H 20/855*** | (2025.01) |
| ***H10H 20/857*** | (2025.01) |

(Continued)

(52) U.S. Cl.

CPC .......... *H10H 20/831* (2025.01); *H10H 20/84* (2025.01); *H10H 20/855* (2025.01); *H10H 20/857* (2025.01); *H10H 29/142* (2025.01); *H10H 20/032* (2025.01); *H10H 20/036* (2025.01)

(58) Field of Classification Search

CPC .. H10H 20/032; H10H 20/036; H10H 20/831; H10H 20/84; H10H 20/853; H10H 20/855; H10H 20/857; H10H 29/142; H10K 59/131; H10K 59/82; H10D 86/441; H10D 86/451; H10W 90/00

See application file for complete search history.

(56) References Cited

U.S. PATENT DOCUMENTS

| | | | |
|---|---|---|---|
| 2020/0144356 | A1 | 5/2020 | Shin et al. |
| 2020/0411630 | A1 | 12/2020 | Kim et al. |
| 2022/0199682 | A1 | 6/2022 | Lee et al. |

(Continued)

FOREIGN PATENT DOCUMENTS

| | | |
|---|---|---|
| KR | 10-2017-0038301 A | 4/2017 |
| KR | 10-2018-0077652 A | 7/2018 |

(Continued)

*Primary Examiner* — Nelson Garces

(74) *Attorney, Agent, or Firm* — Birch, Stewart, Kolasch & Birch, LLP

(57) ABSTRACT

A display device can include a first substrate having an active area and a non-active area, where the non-active area includes a plurality of first areas spaced apart from each other and a plurality of second areas disposed between the plurality of first areas. The display device can further include a plurality of first pad electrodes disposed on the plurality of first areas, a plurality of side lines disposed on the plurality of first pad electrodes, and a plurality of step compensation layers disposed in the plurality of second areas. By additionally forming the step compensation layers in the second areas, it is possible to compensate for step differences between the plurality of first areas and the plurality of second areas.

20 Claims, 6 Drawing Sheets

(51) Int. Cl.

| | |
|---|---|
| ***H10H 29/14*** | (2025.01) |
| *H10H 20/01* | (2025.01) |

(56) References Cited

U.S. PATENT DOCUMENTS

| | | | | |
|---|---|---|---|---|
| 2023/0207739 | A1 | 6/2023 | Park et al. | |
| 2023/0237937 | A1 * | 7/2023 | Choi | G09F 9/3026 257/79 |

FOREIGN PATENT DOCUMENTS

| | | | |
|---|---|---|---|
| KR | 10-2020-0053012 | A | 5/2020 |
| KR | 10-2021-0002287 | A | 1/2021 |
| KR | 10-2022-0088574 | A | 6/2022 |
| WO | 2021/210698 | A1 | 10/2021 |
| WO | 2023/146054 | A1 | 8/2023 |

* cited by examiner

DISPLAY DEVICE HAVING STEP COMPENSATION LAYERS IN AREAS OF A SUBSTRATE

CROSS-REFERENCE TO RELATED APPLICATIONS

This application claims the benefit of and priority to Korean Patent Application No. 10-2022-0132975 filed on Oct. 17, 2022, in the Republic of Korea, the entire contents of which are hereby expressly incorporated by reference into the present application.

BACKGROUND

Technical Field

The present disclosure relates to a display device, and more particularly, to a display device in which visibility is improved by minimizing or reducing a step difference of pad portions.

Discussion of the Related Art

Display devices used in computer monitors, TVs, and mobile phones include organic light emitting displays (OLEDs) that emit light by themselves, and liquid crystal displays (LCDs) that require a separate light source.

Display devices are being applied to various fields of application including not only computer monitors and TVs, but also personal mobile devices. As such, display devices having a reduced volume and weight while having a wide active area are being studied.

In recent years, display devices including light emitting diodes (LEDs) have received attention as the next-generation display devices. Since the LED is formed of an inorganic material rather than an organic material, it has excellent reliability and has a longer lifespan compared to a liquid crystal display device or an organic light emitting display device.

In addition, the LED has a high lighting speed, high luminous efficiency and excellent stability due to high impact resistance and can display a high-luminance image.

SUMMARY OF THE DISCLOSURE

An aspect of the present disclosure is to provide a display device in which step differences between areas where a plurality of pad electrodes are formed and areas between the plurality of pad electrodes, can be reduced.

Another aspect of the present disclosure is to provide a display device in which a gap between a display panel and an optical film is reduced.

Still another aspect of the present disclosure is to provide a display device with improved visibility by filling an empty space between a display panel and an optical film.

Still another aspect of the present disclosure is to provide a display device in which a manufacturing cost is reduced by forming step compensation layers with a minimal pad printing process.

Still another aspect of the present disclosure is to provide a display device that minimizes or reduces a short circuit defect between a plurality of side lines due to a migration phenomenon.

Objects of the present disclosure are not limited to the above-mentioned objects, and other objects, which are not mentioned above, can be clearly understood by those skilled in the art from the following descriptions.

A display device according to an embodiment of the present disclosure includes a first substrate including an active area and a non-active area where the non-active area includes a plurality of first areas spaced apart from each other and a plurality of second areas disposed between the plurality of first areas; a plurality of first pad electrodes disposed on the plurality of first areas; a plurality of side lines disposed on the plurality of first pad electrodes; and a plurality of step compensation layers disposed in the plurality of second areas. Therefore, by additionally forming the step compensation layers in the second areas where the plurality of first pad electrodes and the plurality of side lines are not formed, it is possible to compensate for step differences between the plurality of first areas where the plurality of first pad electrodes and the plurality of side lines are formed and the plurality of second areas.

Other detailed matters of the exemplary embodiments are included in the detailed description and the drawings.

According to one or more embodiments of the present disclosure, by reducing step differences between areas in which a plurality of pad electrodes and side lines are formed and areas in which the plurality of pad electrodes and the side lines are not formed in a non-active area, it is possible to prevent or reduce a delamination defect of an optical film attached to the non-active area.

According to one or more embodiments of the present disclosure, by flattening an upper portion of a non-active area, it is possible to remove a gap between a side insulating layer and an optical film, and prevent or reduce a defect in visibility due to the gap.

According to one or more embodiments of the present disclosure, it is possible to reduce a defect in which portions of a plurality of pad electrodes and side lines are disconnected in contact holes having a high step difference, and to increase contact areas of the pad electrodes and the side lines.

According to one or more embodiments of the present disclosure, since step compensation layers can be formed by a pad printing method, a process can be simplified and a manufacturing cost can be reduced.

According to one or more embodiments of the present disclosure, a short circuit defect due to a migration phenomenon can be minimized or reduced by forming a step compensation layer in an area between a plurality of side lines.

The effects according to one or more embodiments of the present disclosure are not limited to the contents exemplified above, and more various effects are included in the present specification.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
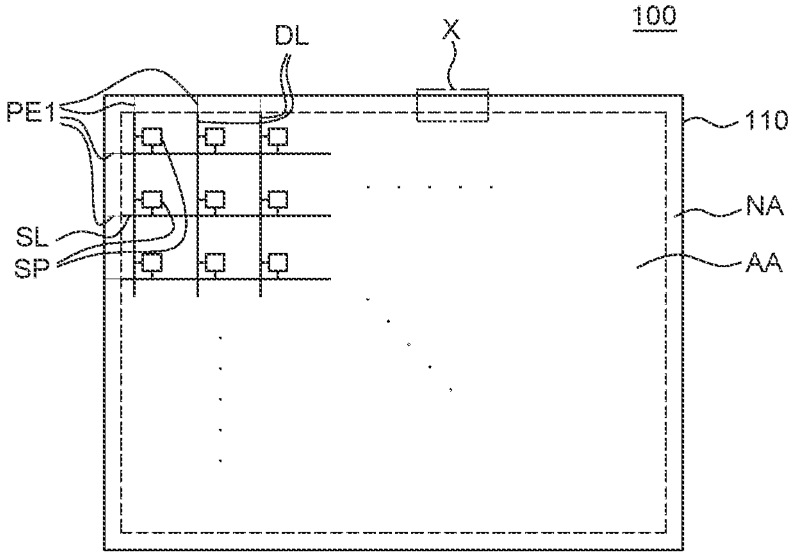
FIG. 1 is a plan view of a display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like or similar reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," "comprising," etc. used herein are generally intended to allow other components to be added unless the terms are used with the term such as "only". Any references to singular can include plural unless expressly stated otherwise.

Components are interpreted to include an ordinary error range or an ordinary tolerance range even if not expressly stated.

When the position relation between two parts is described using the terms such as "on", "above", "over," "below", "under," and "next", one or more parts can be positioned between the two parts unless the terms are used with the term "immediately" or "directly".

When an element or layer is disposed "on" another element or layer, the element or layer can be directly disposed on another element or layer, or other layer(s) or element(s) can be interposed therebetween.

Although the terms "first", "second", and the like are used for describing various components, these components are not confined by these terms. These terms are merely used for distinguishing one component from the other components, and may not define order or sequence. Therefore, a first component to be mentioned below can be a second component in a technical concept of the present disclosure.

Like or similar reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings. All the components of each display device according to all embodiments of the present disclosure are operatively coupled and configured.

Figure 2:
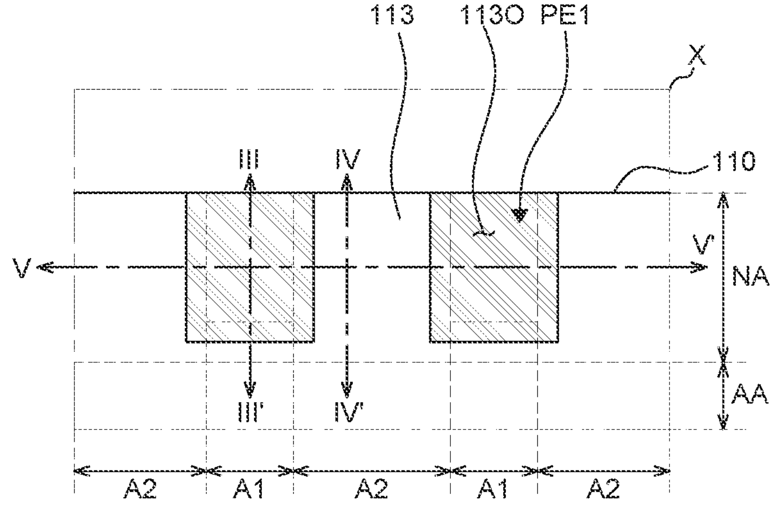
FIG. 2 is an enlarged plan view of region X of FIG. 1.
Figure 3:
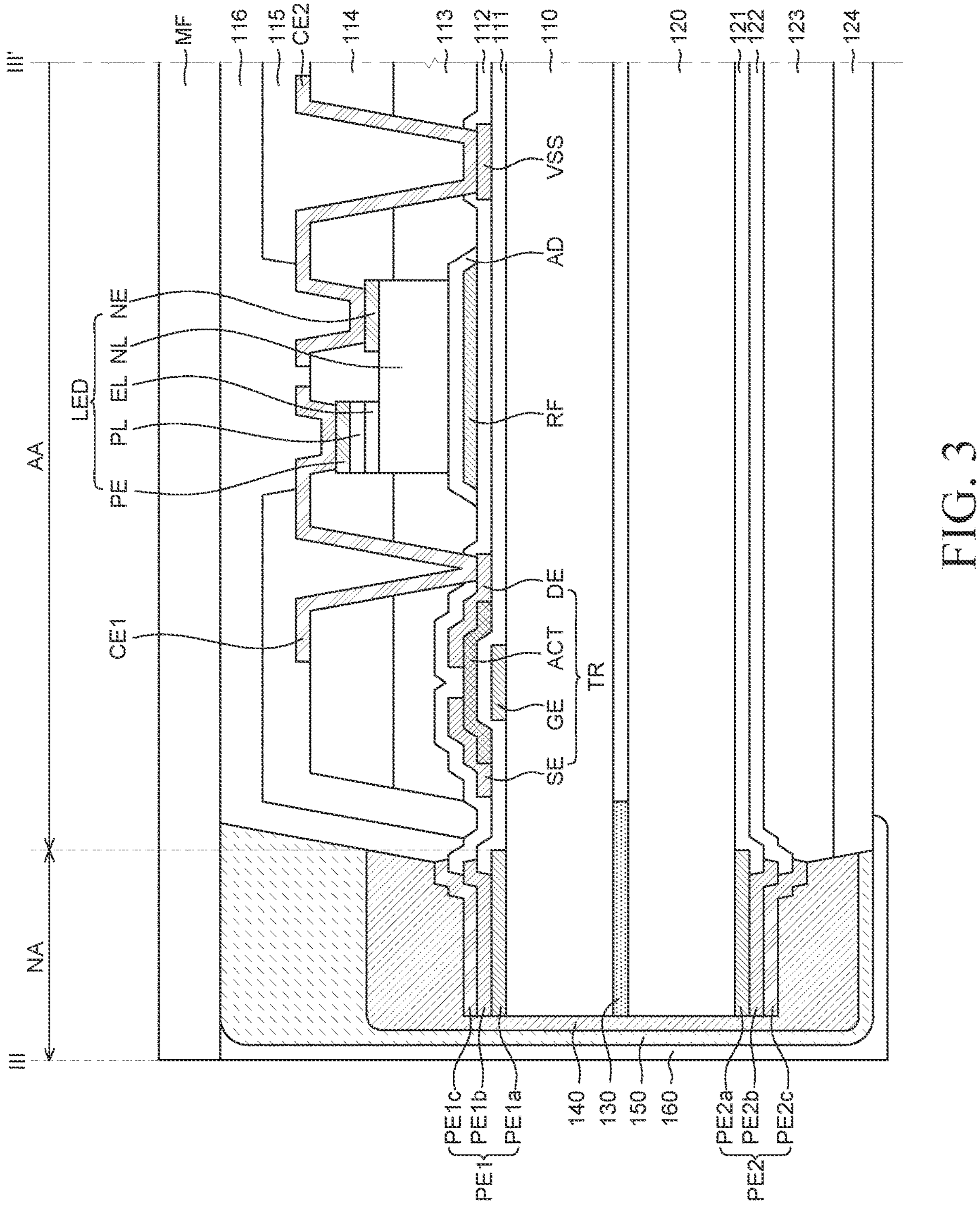
FIG. 3 is a cross-sectional view of the display device taken along of FIG. 2.
Figure 4:
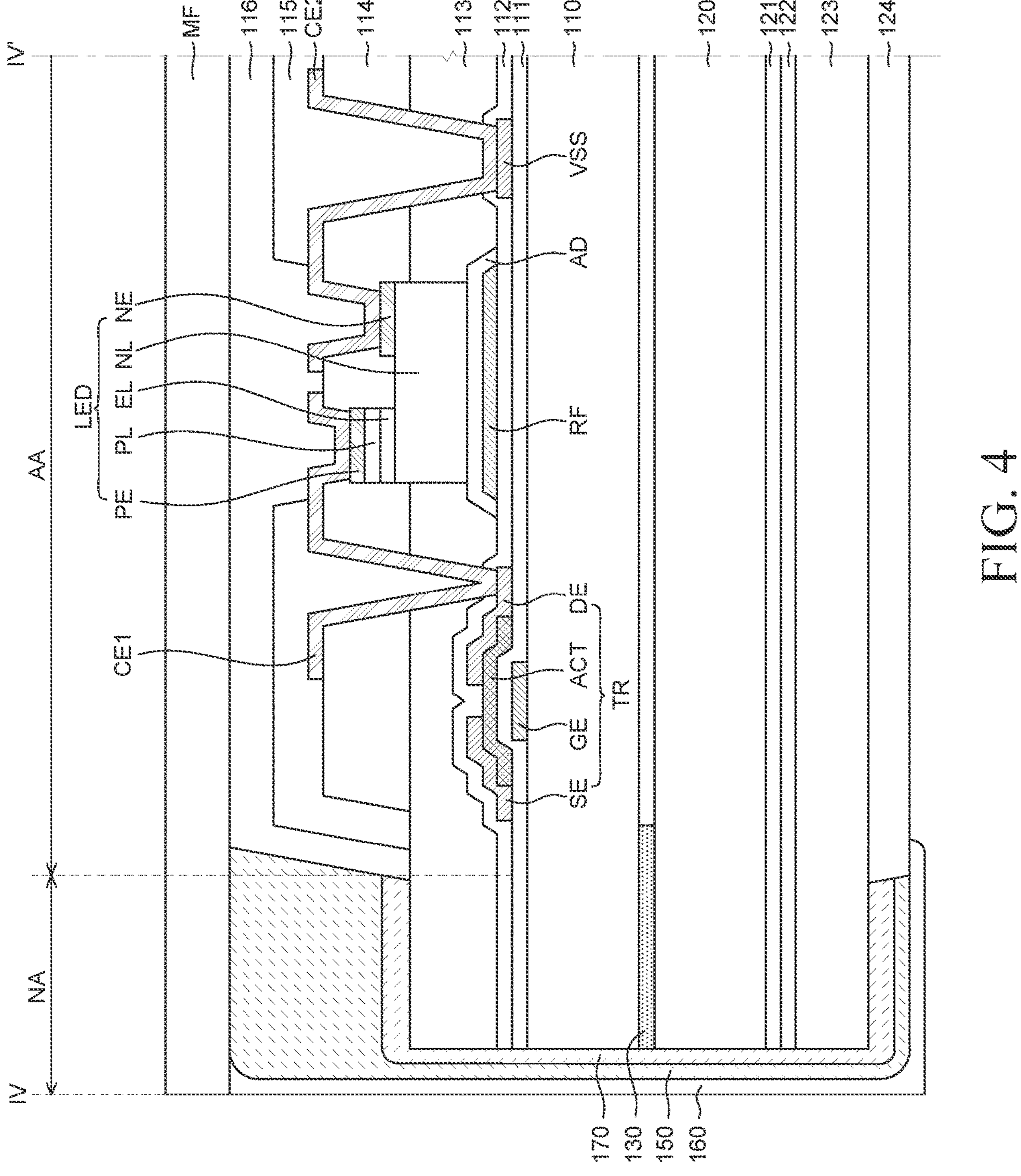
FIG. 4 is a cross-sectional view of the display device taken along IV-IV' of FIG. 2.
Figure 5:
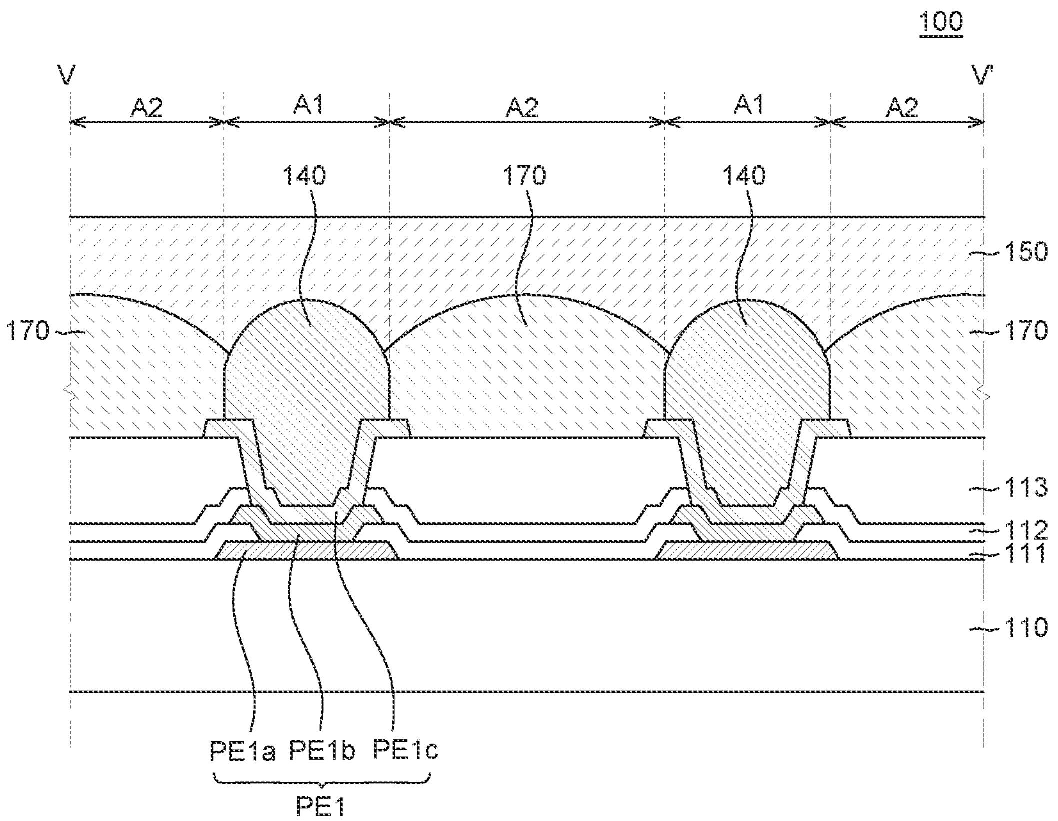
FIG. 5 is a cross-sectional view of the display device taken along V-V' of FIG. 2.

FIG. 1 is a plan view of a display device according to an exemplary embodiment of the present disclosure. FIG. 2 is an enlarged plan view of region X of FIG. 1. FIG. 3 is a cross-sectional view of the display device taken along of FIG. 2. FIG. 4 is a cross-sectional view of the display device taken along IV-IV' of FIG. 2. FIG. 5 is a cross-sectional view of the display device taken along V-V' of FIG. 2.

For convenience of description, a first substrate 110 of a display device 100 is illustrated in FIG. 1. First pad electrodes PE1 and a first planarization layer 113 on the first substrate 110 are illustrated in FIG. 2. In FIG. 5, illustrations of a second substrate 120, components under the second substrate 120, a sealing member 160, and an optical film MF are omitted.

Referring to FIG. 1, the first substrate 110 is a substrate supporting components disposed on the display device 100 and can be an insulating substrate. For example, the first substrate 110 can be formed of glass, resin or the like. Further, the first substrate 110 can be formed to include polymer or plastic. In some embodiments, the first substrate 110 can be formed of a plastic material having flexibility.

An active area AA and a non-active area NA surrounding or being adjacent to the active area AA can be defined on the first substrate 110.

The active area AA is an area where an image is displayed on the display device 100. A plurality of sub-pixels SP constituting a plurality of pixels and circuits for driving the plurality of sub-pixels SP can be disposed in the active area AA. The plurality of sub-pixels SP are minimum units constituting the active area AA. A light emitting element (LED), a thin film transistor TR for driving the light emitting element (LED), and the like can be disposed in each of the plurality of sub-pixels SP. A more detailed description of the plurality of sub-pixels SP will be provided later with reference to FIG. 3.

A plurality of signal lines for transmitting various signals to the plurality of sub-pixels SP are disposed in the active area AA. For example, the plurality of signal lines can include a plurality of data lines DL for supplying data voltages to each of the plurality of sub-pixels SP, a plurality of scan lines SL for supplying scan voltages to each of the plurality of sub-pixels SP, and the like. The plurality of scan lines SL can extend in one direction in the active area AA and be connected to the plurality of sub-pixels SP. The plurality of data lines DL can extend in a direction different from the one direction in the active area AA and be connected to the plurality of sub-pixels SP. In addition, low potential power lines VSS, high potential power lines and the like can be further disposed in the active area AA, but the present disclosure is not limited thereto.

The non-active area NA is an area in which an image is not displayed and can be defined as an area surrounding the active area AA, but not limited thereto. In the non-active area NA, link lines and pad electrodes for transmitting signals to the sub-pixels SP of the active area AA, driver ICs such as gate driver ICs and data driver ICs, and the like can be disposed. For example, a plurality of the first pad electrodes PE1 for transmitting various signals to the plurality of sub-pixels SP on the first substrate 110 are disposed in the non-active area NA.

The plurality of first pad electrodes PE1 are connected between side lines 140 to be described later and the plurality of signal lines of the active area AA, and can transmit signals from a printed circuit board and a plurality of flexible films disposed on a rear surface of the second substrate 120 to the plurality of sub-pixels SP.

In this case, various signal lines connected to the plurality of sub-pixels SP, such as the scan lines SL, the data lines DL, and the low potential power lines VSS can extend from the active area AA to the non-active area NA and be electrically connected to the plurality of first pad electrodes PE1.

Meanwhile, in the present disclosure, it has been described that the active area AA and the non-active area NA are defined on a front surface of the display device 100, but it can be defined that the front surface of the display device 100 has no non-active area NA. However, the present disclosure is not limited thereto. When a tiling display having a large screen is implemented by connecting a plurality of display devices 100 according to an exemplary embodiment of the present disclosure, a distance between an outermost sub-pixel SP of one display device 100 and an outermost sub-pixel SP of another display device 100 adjacent thereto can be implemented to be equal to a distance between the plurality of sub-pixels SP in one display device 100. Accordingly, it is possible to implement a zero bezel in which a bezel area does not substantially exist. Thus, only the active area AA where an image is displayed can be defined on the front surface of the display device 100, but the present disclosure is not limited thereto.

Referring to FIGS. 1 and 3 together, the plurality of sub-pixels SP are defined in the active area AA of the first substrate 110, and a light emitting element LED and a thin film transistor TR are disposed in each of the plurality of sub-pixels SP.

First, the thin film transistor TR is disposed in the active area AA of the first substrate 110. The thin film transistor TR includes a gate electrode GE, an active layer ACT, a source electrode SE, and a drain electrode DE.

The gate electrode GE of the thin film transistor TR is disposed on the first substrate 110. The gate electrode GE can be formed of a conductive material such as copper (Cu), aluminum (Al), molybdenum (Mo), nickel (Ni), titanium (Ti), chromium (Cr), or an alloy thereof, but is not limited thereto.

The active layer ACT is disposed on the gate electrode GE. The active layer ACT can be formed of a semiconductor material such as an oxide semiconductor, amorphous silicon, or polysilicon, but is not limited thereto.

A first passivation layer 111 is disposed between the gate electrode GE and the active layer ACT to insulate the gate electrode GE and the active layer ACT. The first passivation layer 111 for insulating the gate electrode GE and the active layer ACT can also be referred to as a gate insulating layer. The first passivation layer 111 can be configured as a single layer or multiple layers of silicon oxide (SiOx) or silicon nitride (SiNx), but the present disclosure is not limited thereto.

The source electrode SE and the drain electrode DE are disposed on the active layer ACT. The source electrode SE and the drain electrode DE can be formed of a conductive material such as copper (Cu), aluminum (Al), molybdenum (Mo), nickel (Ni), titanium (Ti), chromium (Cr), or an alloy thereof, but the present disclosure is not limited thereto.

The low potential power line VSS is disposed on the first passivation layer 111. The low potential power line VSS is a line for applying a low potential power voltage to the light emitting element LED. The low potential power line VSS can be formed of the same material as the source electrode SE and the drain electrode DE, or can be formed of the same material as the gate electrode GE, but the present disclosure is not limited thereto.

A second passivation layer 112 for protecting the thin film transistor TR is disposed on the source electrode SE and the drain electrode DE. The second passivation layer 112 is disposed on the thin film transistor TR and the low potential power line VSS. The second passivation layer 112 can be configured as a single layer or multiple layers of silicon oxide (SiOx) or silicon nitride (SiNx), but is not limited thereto. The second passivation layer 112 can be omitted according to embodiments.

A reflective layer RF is disposed on the second passivation layer 112. The reflective layer RF is a layer for reflecting light that is directed toward the first substrate 110 from among light emitted from the light emitting element LED, upwardly of the display device 100, and outputting the light to an outside of the display device 100. The reflective layer RF can be formed of a metallic material having high reflectivity.

An adhesive layer AD is disposed on the reflective layer RF. The adhesive layer AD is an adhesive layer AD for bonding the light emitting element LED onto the reflective layer RF, and can insulate the light emitting element LED from the reflective layer RF formed of a metallic material. The adhesive layer AD can be formed of a thermosetting material or a photocurable material, but the present disclosure is not limited thereto. Meanwhile, although FIGS. 3 and 4 illustrate that the adhesive layer AD is partially disposed on only a portion of the first substrate 110 overlapping the reflective layer RF, the adhesive layer AD can be disposed on an entire surface of the active area AA, but the present disclosure is not limited thereto.

The light emitting element LED is disposed on the adhesive layer AD. The light emitting element LED includes an n-type layer NL, a light emitting layer EL, a p-type layer PL, an n-electrode NE, and a p-electrode PE. Hereinafter, it will be described that an LED of a lateral structure is used as the light emitting element LED, but the structure of the light emitting element LED is not limited thereto.

First, the n-type layer NL is disposed on the adhesive layer AD, and the p-type layer PL is disposed on the n-type layer NL. The n-type layer NL and the p-type layer PL can be layers formed by doping a specific material with n-type impurities and p-type impurities. For example, the n-type layer NL and the p-type layer PL can be layers formed by doping materials such as gallium nitride (GaN), indium aluminum phosphide (InAlP), gallium arsenide (GaAs), and the like, with n-type impurities or p-type impurities. The n-type impurity can be silicon (Si), germanium (Ge), tin (Sn), or the like and the p-type impurity can be magnesium (Mg), zinc (Zn), beryllium (Be), or the like, but the present disclosure is not limited thereto.

The light emitting layer EL is disposed between the n-type layer NL and the p-type layer PL. The light emitting layer EL is a layer that emits light from the light emitting element LED. For example, the light emitting layer EL can be formed of indium gallium nitride (InGaN) or gallium nitride (GaN) having a single or multi-quantum well (MQW) structure, but the present disclosure is not limited thereto.

The light emitting element LED can be manufactured by sequentially stacking the n-type layer NL, the light emitting layer EL, and the p-type layer PL, and then, etching a predetermined portion thereof to thereby form the n-electrode NE and the p-electrode PE. At this time, the predetermined portion is a space for separating the n-electrode NE and the p-electrode PE, and a predetermined portion of the p-type layer PL and the light emitting layer EL can be etched to expose a portion of the n-type layer NL. In other words, surfaces of the light emitting element LED on which the n-electrode NE and the p-electrode PE are disposed can have different levels in height rather being a flattened surface.

The n-electrode NE can be disposed on an etched region, for example, on the n-type layer NL exposed through an etching process. The p-electrode PE can be disposed on an unetched region, for example, on the p-type layer PL. The n-electrode NE and the p-electrode PE can be formed of a conductive material. For example, the n-electrode NE and the p-electrode PE can be formed of a transparent conductive material such as indium tin oxide (ITO) or indium zinc oxide (IZO).

As described above, in a state in which the n-type layer NL, the light emitting layer EL, the p-type layer PL, the n-electrode NE, and the p-electrode PE are formed, the light emitting element LED can be disposed such that the n-type layer NL is closer to the reflective layer RF compared to the n-electrode NE and the p-electrode PE.

Subsequently, the first planarization layer 113 is disposed to flatten an upper portion of the thin film transistor TR in the active area AA. The first planarization layer 113 can be formed to flatten upper portions of areas excluding an area where the light emitting element LED is disposed and contact holes. The first planarization layer 113 can be formed of an organic insulating material, for example, benzocyclobutene or an acryl-based organic insulating material, but the present disclosure is not limited thereto.

A second planarization layer 114 is disposed on the first planarization layer 113. The second planarization layer 114 can be disposed over the thin film transistor TR and the light emitting element LED in areas excluding the contact holes. In this case, the second planarization layer 114 can be formed such that partial regions of the p-electrode PE and the n-electrode NE of the light emitting element LED are opened. The second planarization layer 114 can be formed of an organic insulating material, for example, benzocyclobutene or an acryl-based organic insulating material, but the present disclosure is not limited thereto.

Meanwhile, in the present disclosure, it has been described that the first planarization layer 113 and the second planarization layer 114 are used, but a single planarization layer can be used instead of a plurality of planarization layers. However, the present disclosure is not limited thereto. The first connection electrode CE1 can be an electrode for connecting the thin film transistor TR and the p-electrode PE of the light emitting element LED. The first connection electrode CE1 is in contact with the drain electrode DE of the thin film transistor TR through contact holes formed in the first planarization layer 113, the second planarization layer 114, and the second passivation layer 112, and is in contact with the p-electrode PE of the light emitting element LED through a contact hole formed in the second planarization layer 114. However, the present disclosure is not limited thereto, and the first connection electrode CE1 can be defined as being in contact with the source electrode SE of the thin film transistor TR according to a type of the thin film transistor TR. The first connection electrode CE1 can be formed of a conductive material, for example, a transparent conductive material such as indium tin oxide (ITO) or indium zinc oxide (IZO), but the present disclosure is not limited thereto.

The second connection electrode CE2 can be an electrode for connecting the low potential power line VSS and the n-electrode NE of the light emitting element LED. The second connection electrode CE2 is in contact with the low potential power line VSS through contact holes formed in the first planarization layer 113, the second planarization layer 114, and the second passivation layer 112, and is in contact with the n-electrode NE of the light emitting element LED through a contact hole formed in the second planarization layer 114. The second connection electrode CE2 can be formed of a conductive material, for example, a transparent conductive material such as indium tin oxide (ITO) or indium zinc oxide (IZO), but the present disclosure is not limited thereto.

Connection relationships between the first connection electrode CE1, the second connection electrode CE2, the light emitting element LED, and the thin film transistor TR are not limited thereto, and can be varied according to relationships between the light emitting element LED and a pixel circuit for providing a driving current to the light emitting element LED. Accordingly, another connection structure of the first connection electrode CE1 and the second connection electrode CE2 can be described as follows.

The first connection electrode CE1 can be an electrode for connecting the thin film transistor TR and the n-electrode NE of the light emitting element LED. The first connection electrode CE1 is in contact with the source electrode SE of the thin film transistor TR through the contact holes formed in the first planarization layer 113, the second planarization layer 114, and the second passivation layer 112, and is in contact with the n-electrode NE of the light emitting element LED through the contact hole formed in the second planarization layer 114. However, the present disclosure is not limited thereto, and the first connection electrode CE1 can be defined as being in contact with the drain electrode DE of the thin film transistor TR according to the type of the thin film transistor TR.

The second connection electrode CE2 can be an electrode for connecting the high potential power line and the p-electrode PE of the light emitting element LED. The second connection electrode CE2 is in contact with the high potential power line through the contact holes formed in the first planarization layer 113, the second planarization layer 114, and the second passivation layer 112, and is in contact with the p-electrode PE of the light emitting element LED through the contact hole formed in the second planarization layer 114.

Accordingly, when the display device 100 is turned on, different voltage levels that are applied to the drain electrode DE of the thin film transistor TR and the low potential power line VSS, respectively, can be transmitted to the p-electrode PE and the n-electrode NE through the first connection electrode CE1 and the second connection electrode CE2, so that the light emitting element LED can emit light. Alternatively, when the display device 100 is turned on, different voltage levels that are applied to the source electrode SE of the thin film transistor TR and the high potential power line, respectively, can be transmitted to the n-electrode NE and the p-electrode PE through the first connection electrode CE1 and the second connection electrode CE2, so that the light emitting element LED can emit light.

Next, banks 115 are disposed on the second planarization layer 114, the first connection electrode CE1, and the second connection electrode CE2. The bank 115 is an insulating layer for partitioning the plurality of sub-pixels SP. The bank 115 can be disposed between the plurality of sub-pixels SP to prevent or reduce color mixing as the light emitted from the light emitting element LED of one sub-pixel SP is transferred to another sub-pixel SP adjacent thereto. The bank 115 can be formed of an organic insulating material, for example, the same material as the first planarization layer 113 and the second planarization layer 114. In addition, the bank 115 can be formed of an organic insulating material including a black material to cover lines visible through the active area AA.

A protective layer 116 is disposed on the bank 115. The protective layer 116 can flatten an upper portion of the first substrate 110 and protect components under the protective layer 116. The protective layer 116 can be formed of an organic insulating material, for example, benzocyclobutene or an acryl-based organic insulating material, but the present disclosure is not limited thereto.

Referring to FIGS. 2 and 3 together, the non-active area NA of the first substrate 110 includes a plurality of first areas A1 and a plurality of second areas A2 disposed between the plurality of respective first areas A1. The plurality of first areas A1 can be disposed to be spaced apart from each other, and the plurality of second areas A2 can be disposed between the plurality of first areas A1 spaced apart from each other. The plurality of first areas A1 and the plurality of second areas A2 can be alternately disposed. The plurality of respective first areas A1 are areas where the first pad electrodes PE1 and second pad electrodes PE2 are disposed, and the plurality of second areas A2 are areas where the first planarization layer 113 and step compensation layers 170 to be described later are disposed.

First, the plurality of first pad electrodes PE1 are disposed in the plurality of respective first areas A1. The plurality of first pad electrodes PE1 are electrodes for transmitting signals from a driving unit disposed on the rear surface of the second substrate 120 to the plurality of sub-pixels SP on the first substrate 110. The plurality of first pad electrodes PE1 can be disposed at an end portion of the first substrate 110 in the non-active area NA and electrically connected to the side lines 140 covering the end portion of the first substrate 110.

Each of the plurality of first pad electrodes PE1 can be formed of a plurality of conductive layers. For example, each of the plurality of first pad electrodes PE1 includes a first conductive layer PE1*a*, a second conductive layer PE1*b*, and a third conductive layer PE1*c*.

First, the first conductive layer PE1*a* is disposed on the first substrate 110. The first conductive layer PE1*a* can be formed of the same conductive material as the gate electrode GE, and can be formed of, for example, copper (Cu), aluminum (Al), molybdenum (Mo), nickel (Ni), titanium (Ti), chromium (Cr) or an alloy thereof, but the present disclosure is not limited thereto.

The first passivation layer 111 is disposed on the first conductive layer PE1*a*, and the second conductive layer PE1*b* is disposed on the first passivation layer 111. The second conductive layer PE1*b* can be electrically connected to the first conductive layer PE1*a* through a contact hole formed in the first passivation layer 111. The second conductive layer PE1*b* can be formed of the same conductive material as the source electrode SE and the drain electrode DE, and can be formed of, for example, copper (Cu), aluminum (Al), molybdenum (Mo), nickel (Ni), titanium (Ti), chromium (Cr), or an alloy thereof, but the present disclosure is not limited thereto.

The second passivation layer 112 is disposed on the second conductive layer PE1*b*, and the third conductive layer PE1*c* is disposed on the second passivation layer 112. The third conductive layer PE1*c* can be electrically connected to the second conductive layer PE1*b* through a contact hole formed in the second passivation layer 112. The third conductive layer PE1*c* can be formed of the same conductive material as the first and second connection electrodes CE1 and CE2, for example, a transparent conductive material such as indium tin oxide (ITO) or indium zinc oxide (IZO), but the present disclosure is not limited thereto.

In this case, the first conductive layer PE1*a* and/or the second conductive layer PE1*b* of the first pad electrode PE1 can be electrically connected to a plurality of signal lines on the first substrate 110 and supply various signals to the plurality of signal lines and the plurality of sub-pixels SP. For example, the first conductive layer PE1*a* and/or the second conductive layer PE1*b* of the first pad electrode PE1 can be connected to the scan line SL, the data line DL, the low potential power line VSS, and the like disposed in the active area AA and transmit signals to each of them.

The first planarization layer 113 is disposed on portions of the non-active area NA. The first planarization layer 113 can be disposed in the plurality of second areas A2 of the non-active area NA. The first planarization layer 113 can be disposed to extend from the active area AA to the plurality of second areas A2. Further, in the plurality of first areas A1 where the plurality of first pad electrodes PE1 are disposed, the first planarization layer 113 can be partially removed to form openings 1130.

Specifically, referring to FIGS. 2 and 3, in the plurality of first areas A1 of the non-active area NA, at least portions of the first planarization layer 113 can be removed, so that the openings 1130 corresponding to the plurality of first pad electrodes PE1 can be formed. Accordingly, the second conductive layer PE1*b* of the first pad electrode PE1 can be exposed from the opening 1130 of the first planarization layer 113, for example, the contact hole in the first planarization layer 113. In the opening 1130 of the first planarization layer 113, the second conductive layer PE1*b* under the first planarization layer 113 and the third conductive layer PE1*c* on the first planarization layer 113 can be electrically connected to each other.

Referring to FIGS. 2 and 4, in the plurality of second areas A2 of the non-active area NA, the first planarization layer 113 can be disposed between the plurality of respective first pad electrodes PE1. The first planarization layer 113 can be disposed to extend from the active area AA to the plurality of second areas A2 that are areas between the plurality of first pad electrodes PE1.

Accordingly, a planar shape of the first planarization layer 113 can be different from that of the first substrate 110. For example, the planar shape of the first substrate 110 can be a rectangular shape. However, a portion of the first planarization layer 113 corresponding to the non-active area NA is partially patterned, so an overall shape of the first planarization layer 113 is a rectangular shape but an edge portion of the first planarization layer 113 corresponding to the non-active area NA can be formed in an uneven structure.

Meanwhile, in the display device 100 according to an exemplary embodiment of the present disclosure, step differences between the plurality of first areas A1 and the plurality of second areas A2 can be compensated by forming the first planarization layer 113 and the step compensation layers 170 in the plurality of second areas A2 between the plurality of first pad electrodes PE1, and a detailed description thereof will be provided later.

Next, referring to FIG. 3, the second substrate 120 is disposed under the first substrate 110. The second substrate 120 is a substrate supporting components disposed under the display device 100 and can be an insulating substrate. For example, the second substrate 120 can be formed of glass or resin. Further, the second substrate 120 can be formed to include polymer or plastic. The second substrate 120 can be formed of the same material as the first substrate 110. In some embodiments, the second substrate 120 can be formed of a plastic material having flexibility.

A bonding layer 130 is disposed between the first substrate 110 and the second substrate 120. The bonding layer 130 can be formed of a material capable of bonding the first substrate 110 and the second substrate 120 by being cured through various curing methods. The bonding layer 130 can be disposed on only a portion of an area between the first substrate 110 and the second substrate 120 or can be disposed in an entire area.

A plurality of the second pad electrodes PE2 are disposed on the rear surface of the second substrate 120. The plurality of second pad electrodes PE2 are electrodes for transmitting signals from the driving unit disposed on the rear surface of the second substrate 120 to a plurality of the side lines 140 and the plurality of first pad electrodes PE1 and the plurality of signal lines on the first substrate 110. The plurality of second pad electrodes PE2 can be disposed at an end portion of the second substrate 120 in the non-active area NA and electrically connected to the side lines 140 covering the end portion of the second substrate 120.

In this case, the plurality of second pad electrodes PE2 can also be disposed to correspond to the plurality of first areas A1, respectively. Each of the plurality of first pad electrodes PE1 can be disposed to correspond to each of the plurality of second pad electrodes PE2, and thereafter, the first pad electrode PE1 and the second pad electrode PE2 that overlap each other can be electrically connected to each other through the side line 140.

Each of the plurality of second pad electrodes PE2 includes a plurality of conductive layers. For example, each of the plurality of second pad electrodes PE2 includes a fourth conductive layer PE2*a*, a fifth conductive layer PE2*b*, and a sixth conductive layer PE2*c*.

First, the fourth conductive layer PE2*a* is disposed under the second substrate 120. The fourth conductive layer PE2*a* can be formed of a conductive material, such as copper (Cu), aluminum (Al), molybdenum (Mo), nickel (Ni), titanium (Ti), chromium (Cr) or an alloy thereof, but the present disclosure is not limited thereto.

A third passivation layer 121 is disposed under the fourth conductive layer PE2*a*, and the fifth conductive layer PE2*b* is disposed under the third passivation layer 121. The fifth conductive layer PE2*b* can be electrically connected to the fourth conductive layer PE2*a* through a contact hole formed in the third passivation layer 121. The fifth conductive layer PE2*b* can be formed of a conductive material such as copper (Cu), aluminum (Al), molybdenum (Mo), nickel (Ni), titanium (Ti), chromium (Cr), or an alloy thereof, but the present disclosure is not limited thereto.

A fourth passivation layer 122 is disposed under the fifth conductive layer PE2*b*, and a third planarization layer 123 and a fourth planarization layer 124 are disposed under the fourth passivation layer 122. The third planarization layer 123 is disposed in an area overlapping the active area AA and the plurality of second areas A2 of the non-active area NA. The fourth planarization layer 124 is disposed in an area overlapping the active area AA. The third planarization layer 123 and the fourth planarization layer 124 can be formed of an organic insulating material, for example, benzocyclobutene or an acryl-based organic insulating material, but are limited thereto.

The sixth conductive layer PE2*c* is disposed under the fourth planarization layer 124. The sixth conductive layer PE2*c* can be electrically connected to the fifth conductive layer PE2*b* through a contact hole formed in the fourth passivation layer 122. The sixth conductive layer PE2*c* can be formed of a conductive material, for example, a transparent conductive material such as indium tin oxide (ITO) or indium zinc oxide (IZO), but the present disclosure is not limited thereto.

Meanwhile, a driving unit including a plurality of flexible films and a printed circuit board can be disposed on the rear surface of the second substrate 120. The plurality of flexible films are components that supply signals to the plurality of sub-pixels SP by disposing various components such as gate driver integrated circuit (ICs) and data driver ICs on a flexible base film. The printed circuit board is a component that is electrically connected to the plurality of flexible films and supplies signals to the driver IC. Various components for supplying various signals such as driving signals and data signals to the driver IC can be disposed on the printed circuit board.

For example, the fourth conductive layer PE2*a* and/or the fifth conductive layer PE2*b* of the second pad electrode PE2 can extend toward the plurality of flexible films disposed on the rear surface of the second substrate 120 and be electrically connected to the plurality of flexible films. The plurality of flexible films can supply various signals to the plurality of side lines 140, the plurality of first pad electrodes PE1, the plurality of signal lines, and the plurality of sub-pixels SP through the second pad electrodes PE2. Accordingly, signals from the driving unit can be transmitted to the plurality of sub-pixels SP and the signal lines on a front surface of the first substrate 110 through the plurality of second pad electrodes PE2 of the second substrate 120, the side lines 140, and the plurality of first pad electrodes PE1 of the first substrate 110.

Next, the plurality of side lines 140 are disposed on the side surfaces of the first substrate 110 and the second substrate 120. The plurality of side lines 140 can electrically connect the plurality of first pad electrodes PE1 formed on an upper surface of the first substrate 110 and the plurality of second pad electrodes PE2 formed on the rear surface of the second substrate 120. The plurality of side lines 140 can be disposed to surround side surfaces of the display device 100. Each of the plurality of side lines 140 can cover the first pad electrode PE1 at the end portion of the first substrate 110, the side surface of the first substrate 110, the side surface of the second substrate 120, and the second pad electrode PE2 at the end portion of the second substrate 120. For example, the plurality of side lines 140 can be formed by a pad printing method using conductive ink, for example, conductive ink including silver (Ag), copper (Cu), molybdenum (Mo), and chromium (Cr).

The side insulating layer 150 covering the plurality of side lines 140 is disposed. The side insulating layer 150 can be formed to cover the side lines 140 on the upper surface of the first substrate 110, the side surface of the first substrate 110, the side surface of the second substrate 120, and the rear surface of the second substrate 120. The side insulating layer 150 can protect the plurality of side lines 140.

Meanwhile, when the plurality of side lines 140 are formed of a metallic material, a defect or issue in which external light is reflected from the plurality of side lines 140 or light emitted from the light emitting element LED is reflected from the plurality of side lines 140 and is visually recognized by a user can occur. Accordingly, the side insulating layer 150 is configured to include a black material, so that reflection of external light can be suppressed. For example, the side insulating layer 150 can be formed by a pad printing method using an insulating material including a black material, for example, black ink.

The sealing member 160 covering the side insulating layer 150 is disposed. The sealing member 160 can be disposed to surround the side surfaces of the display device 100 and protect the display device 100 from external impacts, moisture, oxygen, and the like. For example, the sealing member 160 can be formed of polyimide (PI), polyurethane, epoxy, and acrylic-based insulating materials, but the present disclosure is not limited thereto.

The optical film MF is disposed on the sealing member 160, the side insulating layer 150, and the protective layer 116. The optical film MF can be a functional film that implements a high quality image while protecting the display device 100. For example, examples of the optical film MF can include an anti-glare film, an anti-reflection film, a low-reflection film, an OLED transmittance controllable film, a polarizing plate, and the like, but the present disclosure is not limited thereto.

Meanwhile, an edge of the sealing member 160 and an edge of the optical film MF can be disposed on the same line. During a manufacturing process of the display device 100, the optical film MF having a size larger than that of the upper portion of the first substrate 110 can be attached to the upper portion of the first substrate 110, and the sealing member 160 covering the side insulating layer 150 can be formed. Thereafter, a laser can be irradiated onto the sealing member 160 and the optical film MF to correspond to an edge of the display device 100, so that a portion of the sealing member 160 and the optical film MF can be cut. Accordingly, a size of the display device 100 can be adjusted and the edge of the display device 100 can be formed flat through a process of cutting an outer portion of the sealing member 160 and the optical film MF.

Meanwhile, referring to FIG. 5, due to a large thickness of the plurality of side lines 140, there can occur step differences between the plurality of first areas A1 in which the plurality of first pad electrodes PE1 and the plurality of side lines 140 are disposed and the plurality of second areas A2 in which the plurality of first pad electrodes PE1 and the plurality of side lines 140 are not disposed. Therefore, in the display device 100 according to an exemplary embodiment of the present disclosure, the first planarization layer 113 can be disposed in the plurality of second areas A2 to decrease height differences between the plurality of first areas A1 in which the plurality of side lines 140 are disposed and the plurality of second areas A2 between the plurality of respective first areas A1.

However, since it can be difficult to sufficiently compensate for the step difference only with the thickness of the first planarization layer 113, the second planarization layer 114 can be further disposed in the plurality of second areas A2. For example, by disposing both the first planarization layer 113 and the second planarization layer 114 in the plurality of second areas A2 of the non-active area NA, the step differences between the plurality of first areas A1 and the plurality of second areas A2 can be compensated, and upper portions of the plurality of first areas A1 and the plurality of second areas A2 can be formed flatter.

However, in a procedure of forming the first and second connection electrodes CE1 and CE2 and the third conductive layer PE1*c* through the same process after the second planarization layer 114 is formed, the third conductive layer PE1*c* may not completely cover the contact holes of the first planarization layer 113 and the second planarization layer 114 and can be disconnected at some points, due to large thicknesses of the first planarization layer 113 and the second planarization layer 114. For example, the third conductive layer PE1*c* may not be evenly formed on inner surfaces of the contact holes of the first planarization layer 113 and the second planarization layer 114 and can be partially disconnected. Additionally, the third conductive layer PE1*c* can also be disconnected near the contact hole due to a high step difference by the large thicknesses of the first planarization layer 113 and the second planarization layer 114.

Therefore, according to the present disclosure, although it is possible to compensate for step differences between areas where the side lines 140 are disposed and areas between the side lines 140 by forming the second planarization layer 114 in the non-active area NA, the third conductive layers PE1*c* or the side lines 140 are disconnected to thereby reduce contact areas thereof and increase resistance, so that reliability of the display device 100 can be lowered.

Therefore, in the display device 100 according to an exemplary embodiment of the present disclosure, by disposing only the first planarization layer 113 in the plurality of second areas A2 of the non-active area NA and forming the third conductive layers PE1*c* and then, additionally forming the step compensation layers 170, it is possible to compensate for step differences between the plurality of first areas A1 in which the plurality of side lines 140 are disposed and the plurality of second areas A2 in which the plurality of side lines 140 are not disposed and at the same time, to prevent or reduce disconnection of the first pad electrodes PE1.

Specifically, referring to FIGS. 4 and 5, a plurality of the step compensation layers 170 are disposed on the side surfaces of the first substrate 110 and the second substrate 120. Each of the plurality of step compensation layers 170 can be disposed to cover the end portion of the first substrate 110 corresponding to the plurality of second areas A2 and the end portion of the second substrate 120 corresponding to the plurality of second areas A2. Accordingly, the plurality of side lines 140 can surround an edge of the first substrate 110 and an edge of the second substrate 120 that correspond to the plurality of first areas A1.

The plurality of step compensation layers 170 can surround the edge of the first substrate 110 and the edge of the second substrate 120 that correspond to the plurality of second areas A2, like the plurality of side lines 140. For example, the step compensation layers 170 can cover an upper surface and side surfaces of the first planarization layer 113, side surfaces of the second passivation layer 112, side surfaces of the first passivation layer 111, the side surfaces of the first substrate 110, the side surfaces of the second substrate 120, side surfaces of the third passivation layer 121, side surfaces of the fourth passivation layer 122, and side surfaces and an upper surface of the third planarization layer 123, that correspond to the plurality of second areas A2.

The plurality of step compensation layers 170 can be formed of an insulating material, for example, black ink including a carbon black material. A short circuit defect between the plurality of side lines 140 can be prevented or reduced by forming the plurality of step compensation layers 170 with an insulating material. In addition, the plurality of step compensation layers 170 can be formed of black ink having a fast-drying property and formed to be thick, and can compensate for the step differences between the plurality of first areas A1 and the plurality of second areas A2.

The plurality of step compensation layers 170 formed of black ink can be formed by a pad printing method, similar to the side lines 140 and the side insulating layer 150. In the pad printing method, a printing plate in which an intaglio pattern is formed can be prepared, and ink can be first filled in the intaglio pattern of the printing plate. In addition, when a printing pad is brought into contact with the intaglio pattern, the ink of the intaglio pattern is applied to the printing pad, and pad printing can be performed by bringing the printing pad with the ink into contact with an object to be printed. For example, the ink filled in the intaglio pattern of the printing plate can be transferred to the object to be printed through the printing pad.

In this case, a thickness of the black ink printed in the pad printing method, for example, a thickness of the step compensation layers 170 can be determined according to a depth of the intaglio pattern of the printing plate. As the depth of the intaglio pattern increases, the amount of filled ink also increases, and the amount of ink transferred to the printing pad can also increase. Accordingly, the thickness of the step compensation layers 170 printed on the side surface of the display device 100 can be adjusted by adjusting the depth of the intaglio pattern of the printing plate. Therefore, since the step compensation layers 170 are formed by the pad printing method in the display device 100 according to an exemplary embodiment of the present disclosure, the step compensation layers 170 having a sufficient thickness can be formed with only one pad printing process. Therefore, a manufacturing process of the step compensation layers 170 can be simplified and costs therefor can also be reduced.

Meanwhile, when the step compensation layers 170 are formed by printing black ink having a fast-drying property on the plurality of second areas A2 during the manufacturing process of the display device 100, the black ink having a spreading property can be rapidly dried before it spreads. If the black ink constituting the step compensation layer 170 has a slow-drying property instead of the fast-drying property, the black ink can spread to surroundings immediately after printing thereof and the thickness of the step compensation layer 170 can be reduced, so it can be disadvantageous to compensate for the step differences between the plurality of first areas A1 and the plurality of second areas A2. Accordingly, it can be advantageous to maintain a shape of the step compensation layer 170 by forming the step compensation layer 170 with fast-drying ink.

For example, the step compensation layer 170 can be formed by mixing additives such as diethylene glycol monoethyl ether (DEGE) and dipropylene glycol methyl ether (DPM) that impart fast-drying properties into black ink allowing for a pad printing process. However, the present disclosure is not limited thereto.

Meanwhile, the side insulating layer 150 formed by the same pad printing method is formed of black ink having a slow-drying property, and can flatten an upper portion of the non-active area NA in which the plurality of side lines 140 and the plurality of step compensation layers 170 are formed, and block reflection of external light from the side lines 140. When the side insulating layer 150 is formed by printing black ink having a relatively slow-drying property on the non-active area NA, the black ink having a spreading property can spread and flatten the non-active area NA.

Accordingly, the side insulating layer 150 can be formed of black ink containing a slow-drying additive, and for example, can be formed by mixing additives such as BCA (2-(2-butoxyethoxy) ethyl acetate), TPV (thermoplastic vulcanizates), and the like into black ink allowing for a pad printing process, but the present disclosure is not limited thereto.

In addition, since the plurality of step compensation layers 170 are formed of black ink with a fast-drying property, and the side insulating layer 150 is formed of black ink with a slow-drying property, an interface between the plurality of step compensation layers 170 and the side insulating layer 150 can be formed. Although both the plurality of step compensation layers 170 and the side insulating layer 150 are formed of black ink, an interface can exist between the black ink of the plurality of step compensation layers 170 and the black ink of the side insulating layer 150 since they have different compositions for fast-drying and slow-drying properties.

Meanwhile, in FIG. 5, only the first pad electrodes PE1, the first planarization layer 113, the side lines 140, the step compensation layers 170, and the side insulating layer 150 on the first substrate 110 are illustrated. However, a cross-sectional structure from the second substrate 120 to the side insulating layer 150 on the rear surface of the second substrate 120 is also substantially the same as the structure of FIG. 5.

Therefore, in the display device 100 according to an exemplary embodiment of the present disclosure, the first planarization layer 113 and the step compensation layers 170 are formed in regions between the plurality of side lines 140 to compensate for the step differences between the plurality of first areas A1 and the plurality of second areas A2, so that a gap between the side insulating layer 150 and the optical film MF can be removed.

For example, one surface of the optical film MF overlapping the plurality of second areas A2 can all come into contact with the side insulating layer 150. If the step compensation layer 170 is not disposed and only the first planarization layer 113 is disposed in the plurality of second areas A2, it is difficult to fill spaces surrounded by an upper surface of the first planarization layer 113 and the plurality of side lines 140, and an upper surface of the side insulating layer 150 can be formed in a curved shape. Therefore, when the optical film MF is directly attached onto the side insulating layer 150, a gap is formed between the optical film MF and the side insulating layer 150 in the plurality of second areas A2, and thus the optical film MF is delaminated, and poor visibility can occur in this gap.

Accordingly, in the display device 100 according to an exemplary embodiment of the present disclosure, the step compensation layers 170 are additionally formed in empty spaces surrounded by the plurality of side lines 140 and the first planarization layer 113 in the plurality of second areas A2, so that the side insulating layer 150 formed on the step compensation layers 170 and the side lines 140 can be formed more flatly, and the gap between the side insulating layer 150 and the optical film MF in the non-active area NA can be prevented or reduced.

In the display device 100 according to an exemplary embodiment of the present disclosure, after formation of the first pad electrodes PE1 is completed, the step compensation layers 170 are formed in spaces between the plurality of side lines 140 to compensate for the step differences, so that disconnection of the first pad electrodes PE1 and the side lines 140 can be prevented or reduced. Specifically, in order to reduce step differences between the plurality of first areas A1 in which the plurality of first pad electrodes PE1 are formed and the plurality of second areas A2 in which the plurality of first pad electrodes PE1 are not formed, a portion of the insulating layers formed in the active area AA can extend to the plurality of second areas A2. For example, the first planarization layer 113 is formed to extend to the plurality of second areas A2 of the non-active area NA, so that step differences between the plurality of first areas A1 and the plurality of second areas A2 can be partially compensated. However, since all of the step differences between the plurality of first areas A1 and the plurality of second areas A2 cannot be compensated for with only the first planarization layer 113, a configuration such as the second planarization layer 114 can be additionally formed in the plurality of second areas A2.

If the second planarization layer 114 is formed in the plurality of second areas A2, it can compensate for the step difference, but the third conductive layer PE1*c* of the first pad electrode PE1 formed on the second planarization layer 114 together with the first connection electrode CE1 and the second connection electrode CE2 can be disconnected in the contact holes passing through the second planarization layer 114 and the first planarization layer 113 and having a large depth. For example, it is difficult to evenly form the third conductive layer PE1*c* within the contact holes passing through the first planarization layer 113 and the second planarization layer 114 that are thick, and the third conductive layer PE1*c* can be disconnected in some areas. In this case, a contact area between the third conductive layer PE1*c* and the side line 140 formed on the third conductive layer PE1*c* is reduced, and defects such as an increase in resistance and heat generation can occur.

Accordingly, in the display device 100 according to an exemplary embodiment of the present disclosure, since the step compensation layer 170 is formed in a state in which both the third conductive layer PE1*c* and the side line 140 are formed, it is possible to prevent or reduce the third conductive layer PE1*c* from being disconnected in contact holes with a high step difference, and a contact area between the first pad electrode PE1 and the side line 140 can be maximally secured, so that reliability of the display device 100 can be improved.

In the display device 100 according to an exemplary embodiment of the present disclosure, the step compensation layers 170 can be formed by a pad printing method, thereby simplifying a process and reducing manufacturing costs. In order to reduce the step differences between the plurality of first areas A1 and the plurality of second areas A2, the first planarization layer 113 can be additionally formed in the plurality of second areas A2. However, in a process of forming a planarization layer such as the first planarization layer 113, there is a limit to forming the thickness of the planarization layer, and the process can or should be performed several times in order to compensate for the step difference only with the material of the planarization layer. Unlike this, in the pad printing method in which a material of the step compensation layer 170 is printed by bringing a printing pad into contact with the display device 100 while the material of the step compensation layer 170 is applied to the printing pad, the amount of ink applied to the printing pad can be controlled by adjusting a depth of an intaglio pattern of a printing plate. Thus, the step compensation layer 170 with a large thickness can be formed through only one process. Accordingly, in the display device 100 according to an exemplary embodiment of the present disclosure, since the step compensation layer 170 is formed by a pad printing method, a process can be simplified and manufacturing costs can be reduced.

Figure 6:
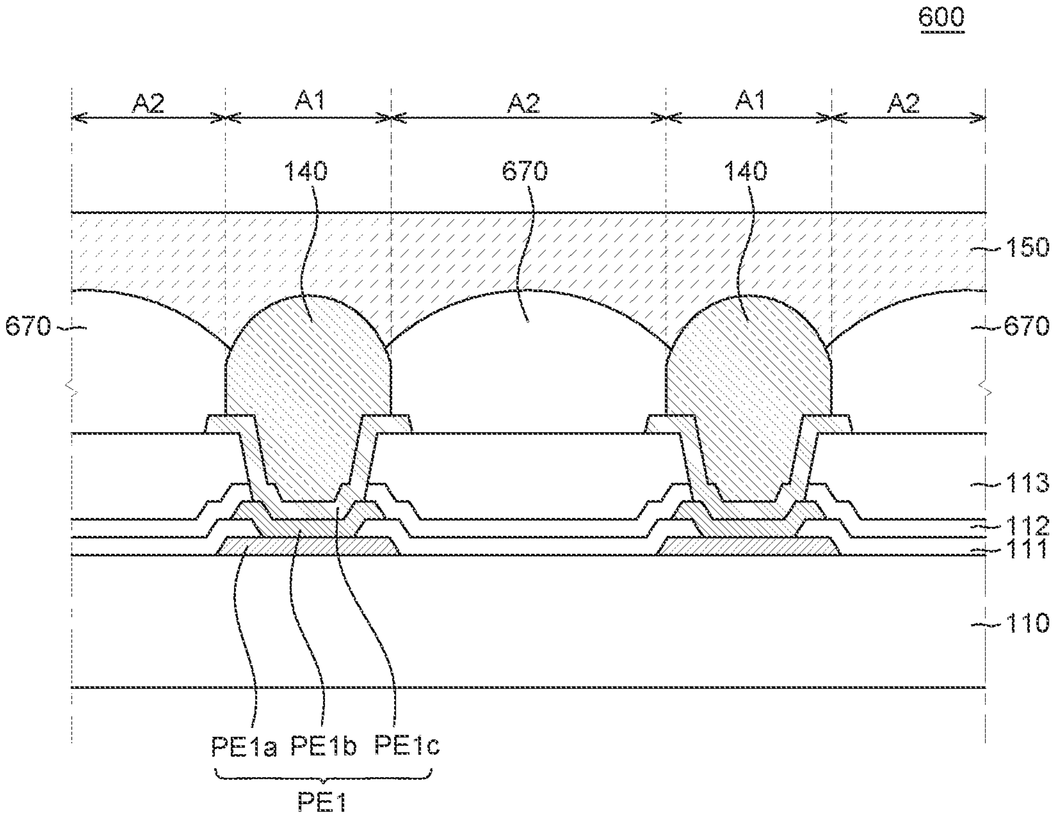
FIG. 6 is a cross-sectional view of a non-active area of a display device according to another embodiment of the present disclosure.

FIG. 6 is a cross-sectional view of a non-active area of a display device according to another exemplary embodiment of the present disclosure. Since other configurations of a display device 600 of FIG. 6 are substantially identical to those of the display device 100 of FIGS. 1 to 5 except for a difference in terms of step compensation layers 670, duplicate descriptions will be omitted or may be briefly provided.

Referring to FIG. 6, the step compensation layers 670 are disposed in the plurality of second areas A2, which are areas in which the plurality of first pad electrodes PE1 and the plurality of side lines 140 are not formed. The step compensation layer 670 can be formed of an insulating material that has a moisture barrier property and can be printed by a pad printing method. For example, the step compensating layer 670 can be formed of any one of siloxane, epoxy, tuffy, and acrylic-based insulating materials having a moisture barrier property, but the present disclosure is not limited thereto.

In the display device 600 according to another exemplary embodiment of the present disclosure, a short circuit defect/issue between the plurality of side lines 140 due to a migration phenomenon can be prevented or reduced by using the step compensation layer 670. The migration phenomenon preferably means that metal components constituting the plurality of side lines 140 are ionized and diffused to the surroundings thereof. Due to the migration phenomenon, the metal components constituting the side lines 140 diffuse to the surroundings, and a short circuit defect between the side lines 140 adjacent to each other can occur.

However, in the display device 600 according to another exemplary embodiment of the present disclosure, the step compensation layers 670 having a moisture barrier property are disposed between the plurality of side lines 140, so that it is possible to block diffusion of the metal components constituting the side lines 140. Accordingly, short circuit defects/issues of the plurality of side lines due to the migration phenomenon can be prevented or reduced by forming the plurality of step compensation layers 670 with an insulating material having moisture barrier properties.

The exemplary embodiments of the present disclosure can also be described as follows:

According to an aspect of the present disclosure, there is provided a display device. The display device includes a first substrate including an active area and a non-active area including a plurality of first areas spaced apart from each other and a plurality of second areas disposed between the plurality of first areas, a plurality of first pad electrodes disposed on the plurality of first areas, a plurality of side lines disposed on the plurality of first pad electrodes, and a plurality of step compensation layers disposed in the plurality of second areas.

The display device can further include a first planarization layer disposed between the first substrate and the plurality of step compensation layers in the plurality of second areas.

Each of the plurality of first pad electrodes can include a first conductive layer disposed on the first substrate, a second conductive layer disposed on the first conductive layer, and a third conductive layer disposed on the second conductive layer and the first planarization layer.

The display device can further include a second planarization layer disposed on the first planarization layer, the first planarization layer can be disposed in the active area and the plurality of second areas, and the second planarization layer can be disposed in the active area and spaced apart from the third conductive layer.

A planar shape of an edge of the first planarization layer can have an uneven structure.

The display device can further include a side insulating layer covering the plurality of side lines and the plurality of step compensation layers, and an optical film disposed on the side insulating layer.

One surface of the optical film overlapping the plurality of second areas can be all in contact with the side insulating layer.

The plurality of step compensation layers can be formed of black ink having a fast-drying property, the side insulating layer can be formed of black ink having a slow-drying property.

The plurality of step compensation layers can be formed of any one of siloxane, epoxy, tuffy, and acrylic-based insulating materials.

The display device can further include a second substrate disposed under the first substrate, and a plurality of second pad electrodes disposed under the second substrate, the plurality of side lines can extend from the plurality of first pad electrodes toward side surfaces of the first substrate and side surfaces and a rear surface of the second substrate and can be electrically connected to the plurality of second pad electrodes.

The display device can further include a third planarization layer disposed below the second substrate and overlapping the plurality of second areas, the plurality of step compensation layers can surround an upper surface and side surfaces of the first planarization layer, side surfaces of the first substrate, side surfaces of the second substrate, and side surfaces and a rear surface of the third planarization layer.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure.

What is claimed is:

1. A display device, comprising:

a first substrate including an active area and a non-active area, the non-active area including a plurality of first areas spaced apart from each other and a plurality of second areas disposed between the plurality of first areas;

a plurality of first pad electrodes disposed on the plurality of first areas;

a plurality of side lines disposed on the plurality of first pad electrodes; and a plurality of step compensation layers disposed in the plurality of second areas and not disposed in the plurality of first areas.

2. The display device of claim 1, further comprising:

a first planarization layer disposed between the first substrate and the plurality of step compensation layers in the plurality of second areas.

3. The display device of claim 2, wherein each of the plurality of first pad electrodes includes:

a first conductive layer disposed on the first substrate;

a second conductive layer disposed on the first conductive layer; and a third conductive layer disposed on the second conductive layer and the first planarization layer.

4. The display device of claim 3, further comprising:

a second planarization layer disposed on the first planarization layer, wherein the first planarization layer is disposed in the active area and the plurality of second areas, and the second planarization layer is disposed in the active area and spaced apart from the third conductive layer.

5. The display device of claim 4, wherein a planar shape of an edge of the first planarization layer has an uneven structure.

6. The display device of claim 1, further comprising:

a side insulating layer covering the plurality of side lines and the plurality of step compensation layers; and an optical film disposed on the side insulating layer.

7. The display device of claim 6, wherein one surface of the optical film overlapping the plurality of second areas is all in contact with the side insulating layer.

8. The display device of claim 6, wherein the plurality of step compensation layers are formed of black ink having a fast-drying property, and the side insulating layer is formed of black ink having a slow-drying property.

9. The display device of claim 6, wherein the plurality of step compensation layers are formed of any one of siloxane, epoxy, tuffy, and acrylic-based insulating materials.

10. The display device of claim 6, further comprising:

a second substrate disposed below the first substrate; and a plurality of second pad electrodes disposed below the second substrate, wherein the plurality of side lines extend from the plurality of first pad electrodes toward side surfaces of the first substrate and side surfaces and a rear surface of the second substrate, and are electrically connected to the plurality of second pad electrodes.

11. The display device of claim 10, further comprising:

a first planarization layer disposed on the first substrate and overlapping the plurality of second areas; and a third planarization layer disposed below the second substrate and overlapping the plurality of second areas, wherein the plurality of step compensation layers surround an upper surface and side surfaces of the first planarization layer, side surfaces of the first substrate, side surfaces of the second substrate, and side surfaces and a rear surface of the third planarization layer.

12. The display device of claim 6, further comprising a sealing member covering the side insulation layer, and an edge of the sealing member and an edge of the optical film being disposed on a same line.

13. The display device of claim 12, wherein the sealing member forms an outside edge of the display device.

14. The display device of claim 12, further comprising a protective layer planarizing an upper portion of the first substrate, wherein the optical film is further disposed on the sealing member and the protective layer.

15. The display device of claim 12, wherein the side insulating layer is interposed between the plurality of step compensation layers and the sealing member.

16. The display device of claim 6, wherein the side insulating layer contacts the plurality of side lines in the plurality of first areas and contacts the plurality of step compensation layers in the plurality of second areas.

17. The display device of claim 1, wherein thicknesses of the plurality of step compensation layers vary in the plurality of second areas.

18. A display device, comprising:

a first substrate including an active area and a non-active area, the non-active area including a plurality of first areas spaced apart from each other and a plurality of second areas disposed between the plurality of first areas;

a plurality of first pad electrodes disposed on the plurality of first areas;

a plurality of side lines disposed on the plurality of first pad electrodes;

a plurality of step compensation layers disposed in the plurality of second areas;

a side insulating layer covering the plurality of side lines and the plurality of step compensation layers;

a second substrate disposed below the first substrate; and a plurality of second pad electrodes disposed below the second substrate, wherein the plurality of side lines extend from the plurality of first pad electrodes toward side surfaces of the first substrate and side surfaces and a rear surface of the second substrate, and are electrically connected to the plurality of second pad electrodes.

19. The display device of claim 18, further comprising:

a first planarization layer disposed on the first substrate and overlapping the plurality of second areas; and a third planarization layer disposed below the second substrate and overlapping the plurality of second areas, wherein the plurality of step compensation layers surround an upper surface and side surfaces of the first planarization layer, side surfaces of the first substrate, side surfaces of the second substrate, and side surfaces and a rear surface of the third planarization layer.

20. A display device, comprising:

a first substrate including an active area and a non-active area, the non-active area including a plurality of first areas spaced apart from each other and a plurality of second areas disposed between the plurality of first areas;

a plurality of first pad electrodes disposed on the plurality of first areas;

a plurality of side lines disposed on the plurality of first pad electrodes;

a plurality of step compensation layers disposed in the plurality of second areas; and a side insulating layer covering the plurality of side lines and the plurality of step compensation layers, wherein the plurality of step compensation layers are formed of any one of siloxane, epoxy, tuffy, and acrylic-based insulating materials.

* * * * *